United States Patent [19]
Wu

[11] Patent Number: 6,160,457
[45] Date of Patent: Dec. 12, 2000

[54] UNIVERSAL CRYSTAL-OSCILLATOR INPUT/OUTPUT CIRCUIT FOR APPLICATION-SPECIFIC INTEGRATED CIRCUIT WITH ENHANCED CHARGE DEVICE MODE ELECTROSTATIC DISCHARGE PROTECTION

[75] Inventor: Jeng-Huang Wu, Taipei, Taiwan

[73] Assignee: Faraday Technology Corp., Hsinchu, Taiwan

[21] Appl. No.: 09/327,084

[22] Filed: Jun. 4, 1999

[51] Int. Cl.[7] .................................................. H03B 5/00
[52] U.S. Cl. ...................................... 331/116 FE; 331/158
[58] Field of Search ............................. 331/116 FE, 158, 331/116 R, DIG. 3

*Primary Examiner*—Arnold Kinkead
*Attorney, Agent, or Firm*—J. C. Patents; Jaiwel Huang

[57] ABSTRACT

A universal crystal-oscillator input/output (I/O) circuit is provided for use with an ASIC (Application Specific Integrated Circuit) device, and which can help enhance the electrostatic discharge (ESD) protection on the ASIC device in Charge Device Mode (CDM). This universal crystal-oscillator I/O circuit can help reduce the total number of I/O components in the ASIC library used to construct the IC device, allowing the design and management of ASIC library to be more simplified and convenient, making ASIC more cost-effective to implement. Moreover, this universal crystal-oscillator I/O circuit can help improve the performance of the oscillator circuit, allowing ASIC designers to have more convenience and flexibility in ASIC design. It can be fast in starting oscillation and low in power consumption. In CDM ESD test, the ESD current flowing into the universal crystal-oscillator I/O circuit would be drained away through the third PMOS transistor or the third NMOS transistor, thus preventing the internal circuitry of the ASIC device from being damaged by the ESD current. This universal crystal-oscillator I/O circuit is therefore able to remove electrostatic electricity accumulated on the IC substrate in CDM ESD test, allowing the ASIC device to easily pass the CDM ESD test.

14 Claims, 4 Drawing Sheets

UNIVERSAL CRYSTAL-OSCILLATOR INPUT/OUTPUT CIRCUIT FOR APPLICATION-SPECIFIC INTEGRATED CIRCUIT WITH ENHANCED CHARGE DEVICE MODE ELECTROSTATIC DISCHARGE PROTECTION

BACKGROUND OF THE INVENTION

1. Field of the Invention

This invention relates to integrated circuit (IC) technology, and more particularly, to a universal crystal-oscillator input/output (I/O) circuit for use with an ASIC (Application Specific Integrated Circuit) device, and which can hell) enhance the ESD (Electrostatic Discharge) protection on the ASIC device in Charge Device Mode (CDM).

2. Description of Related Art

In the fabrication of ICs, electrostatic electricity would easily cause damage to fabricated IC devices. It can occur at many places in the factory, such as the body of an operator and the moving parts of factory installations. When electrostatic electricity comes into touch with an IC device, it can cause electrostatic, discharge (ESD) to the IC device in various modes, such as Human Body Mode (HBM), Charge Device Mode (CDM), and Machine Mode (MM). The ESD would easily cause damage to the IC device.

MOSFET (metal-oxide-semiconductor field-effect transistor) based IC devices are particularly vulnerable to ESD due to the high input impedance and low breakdown voltage of the MOSFET. One solution to this problem is to provide an ESD protection circuit at the I/O ports of the MOSFET-based IC device.

Crystal Oscillator Pad is an important component in ASIC (Application Specific Integrated Circuit) library, which provides a high quality (Q) factor that allows the output oscillator frequency to be highly stable. With advances in IC technology, however, a single ASIC library now can contain varieties of Crystal Oscillator Pad components, which causes inconvenience to the ASIC library vendors and ASIC designers.

FIG. 1 is a schematic circuit diagram of a conventional CMOS (complementary metal-oxide-semiconductor) based crystal-oscillator I/O circuit. As shown, this CMOS-based crystal-oscillator I/O circuit includes a PMOS (P-type metal-oxide-semiconductor) transistor 12, an NMOS (N-type metal-oxide-semiconductor) transistor 14, a feedback resistor 16, and a crystal 18. The PMOS transistor 12 and the NMOS transistor 14 in combination constitute a CMOS transistor, as designated by the reference numeral 15. This CMOS transistor 15 serves as an inverter and an amplifier. Moreover, the CMOS transistor 15 is mounted on the inside of an ASIC, as the part enclosed by the dashed box indicated by the reference numeral 10. The feedback resistor 16 is used to provide a suitable DC operating point that can provide the required bias to the CMOS transistor 15. The crystal 18 is used to limit the output frequency of the crystal oscillator.

Conventionally, a ASIC library is provided with a variety of crystal-oscillator I/O components for the designer to select. However, this would increase the implementation cost of the ASIC library. Moreover, these crystal-oscillator I/O components are all unable to provide the optimal device transconductance for various kinds of voltage sources and oscillation frequency, and therefore, would not satisfy different customer requirements. For instance, some customers would request a voltage down conversion from, for example, 3.3 V to 2.4 V or 1.5 V.

Moreover, CDM ESD protection on VLSI can easily fail. From actual CDM ESD test, it was found that the IO circuit would be incapable of ineffectively drain the electrostatic electricity accumulated on the IC substrate without CDM ESD protection circuit, thus resulting in a poor protection capability to the oscillator I/O circuit. In consequence, he oscillator I/O circuit would be easily damaged by ESD.

SUMMARY OF THE INVENTION

It is therefore an objective of this invention to provide a universal crystal-oscillator I/O circuit for ASIC, which can help reduce the total number of I/O components in the ASIC library used by the designer to build an ASIC device.

It is another objective of this invention to provide a universal crystal-oscillator I/O circuit for ASIC, which can help enhance the CDM ESD protection to the ASIC device.

In accordance with the foregoing and other objectives of this invention, a universal crystal-oscillator I/O circuit is provided, which is designed for use with an ASIC device with CDM ESD protection. The universal crystal-oscillator I/O circuit of the invention comprises: a first PMOS transistor, whose source is connected to a system voltage; a second PMOS transistor whose source is connected to the system voltage and whose gate is connected to the drain of the first PMOS transistor; a third PMOS transistor, whose source is connected to the system voltage and whose drain is connected to the drain of the second PMOS transistor; a first NMOS transistor, whose source is connected to the ground and whose drain is connected to the drain of the first PMOS transistor; a second NMOS transistor, whose source is connected to the ground, whose gate is connected to the drain of the first NMOS transistor, and whose drain is connected to the drain of the second PMOS transistor; a third NMOS transistor, whose source is tied to the gate thereof and connected to the ground, and whose drain is connected both to the drain of the third PMOS transistor and to the drain of the second NMOS transistor. Moreover, the universal crystal-oscillator I/O circuit of the invention includes a control logic unit having three output ports respectively connected to the gate of the first PMOS transistor, the gate of the third PMOS transistor, and the gate of the first NMOS transistor, for selectively controlling the respective ON/OFF states of the first PMOS transistor, the third PMOS transistor, and the first NMOS transistor. Furthermore, the universal crystal-oscillator I/O circuit of the invention includes a first transmission gate whose output port is connected to the drain of the first PMOS transistor and whose control port is connected to the control logic unit, with the ON/OFF state thereof being controlled by the control logic unit; and a second transmission gate whose input port is connected to the input port of the first transmission gate, and whose output port is connected to the drain of the first NMOS transistor, and whose control port is connected to the control logic unit, with the ON/OFF state thereof being controlled by the control logic unit.

The invention can help reduce the total number of I/O components in the ASIC library used to construct the IC device, allowing the design and management of ASIC library to be more simplified and convenient, making ASIC more cost-effective to implement. Moreover, the invention can help improve the performance of the oscillator circuit, allowing ASIC designers to have more convenience and flexibility in ASIC design. It is also fast in switching speed and low in power consumption.

In CDM ESD test, the electrostatic electricity accumulated on IC substrate would be drained away through the first NMOS transistor and NMOS of second transmission gate, thus preventing the internal circuitry of the ASIC device from being damaged by the ESD current. The invention is therefore able to remove electrostatic electricity accumulated on the IC substrate in CDM ESD test, allowing the ASIC device to easily pass the CDM ESD test.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
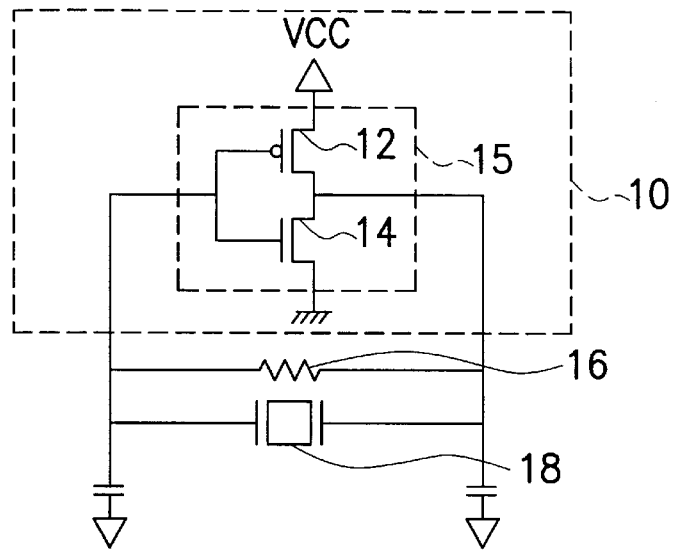
FIG. 1 is a schematic circuit diagram of a conventional CMOS-based crystal-oscillator I/O circuit.
Figure 2:
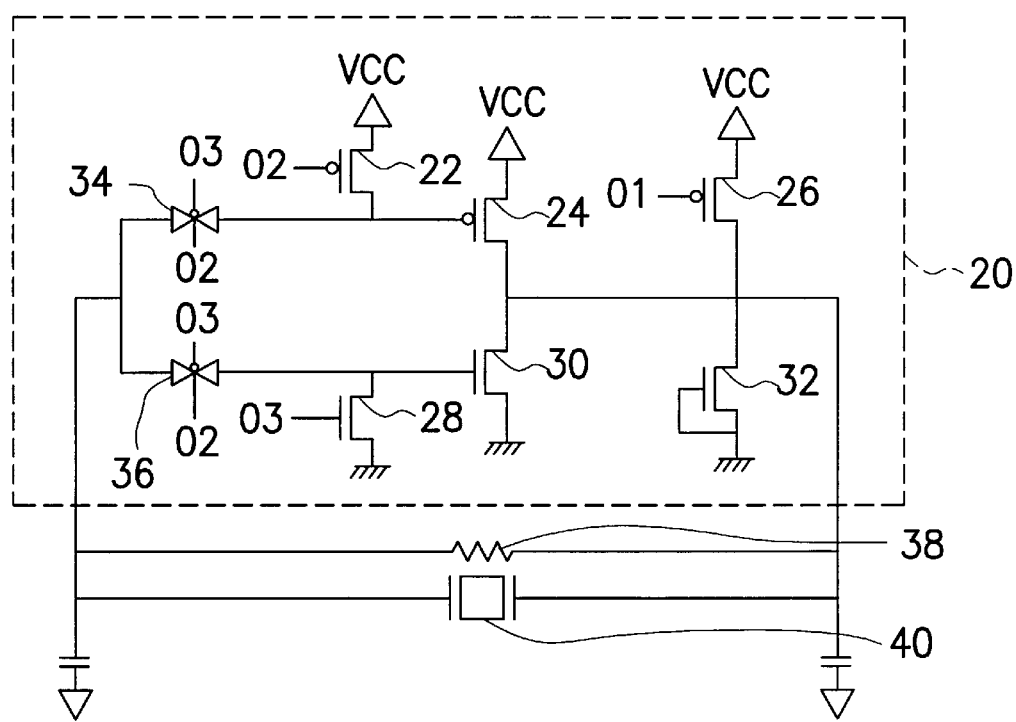
FIG. 2 is a schematic diagram showing the circuit structure of the universal crystal-oscillator I/O circuit according to the invention.
Figure 3:
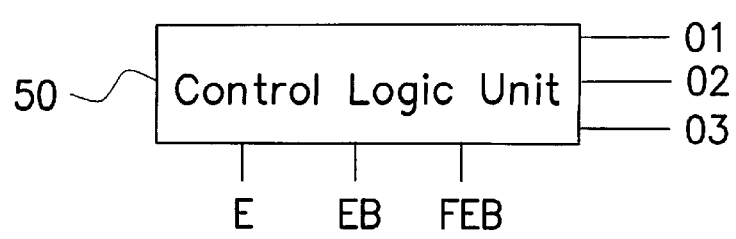
FIG. 3 is a schematic diagram of a control logic unit which controls the operation of the universal crystal-oscillator I/O circuit of the invention.

FIG. 2 is a schematic diagram showing the circuit structure of the universal crystal-oscillator I/O circuit according to the invention; and FIG. 3 is a schematic diagram of a control logic unit which controls the operation of the universal crystal-oscillator I/O circuit of the invention.

As shown in FIG. 2, the universal crystal-oscillator I/O circuit of the invention includes three PMOS transistors 22, 24, 26; three NMOS transistors 28, 30, 32; two transmission gates 34, 36; a feedback resistor 38; and a crystal 40. In this embodiment, all the circuit elements exclusive of the feedback resistor 38 and the crystal 40 are incorporated within an ASIC device, as the part enclosed by the dashed box indicated by the reference numeral 20. The feedback resistor 38 is used to provide a suitable DC operating point that can provide the required bias to the universal crystal-oscillator I/O circuit. The crystal oscillator 40 is used to limit the output frequency of the crystal oscillator. Furthermore, the NMOS transistor 32 and the PMOS transistor 26 are used in combination for HBM ESD protection at output node of the ASIC device 20.

FIG. 3 is a schematic diagram of a control logic unit 50 used to control the operation of the universal crystal-oscillator I/O circuit of FIG. 2. As shown, the control logic unit 50 has three input ports E, EB, FEB, and three output ports O1, O2, O3 respectively connected to the gate of the PMOS transistor 26 (FIG. 2), the, gate of the PMOS transistor 22 (FIG. 2), and the gate of the NMOS transistor 28 (FIG. 2). Moreover, the output ports O2, O3 are connected both to the transmission gate 34 and the transmission gate 36.

In accordance with the invention, the control logic unit 50 is designed to perform a predesigned output-to-input characteristic shown in table 1.

TABLE 1

| E | EB | O1 | O2 | O3 |
|---|----|----|----|----|
| 0 | 0  | 0  | 0  | 1  |
| 0 | 1  | 1  | 0  | 1  |
| 0 | 0  | 1  | 1  | 0  |
| 1 | 1  | 1  | 0  | 1  |

In this preferred embodiment, it is assumed that a logic-low voltage state represents the binary value 0, while a logic-high voltage state represents the binary value 1. However, this representation is merely a design choice and not intended to limit the scope of the invention. From the foregoing table, it can be learned that when the two-bit input signal (E, EB)=(0, 0), it will cause the output (O1, O2, O3) (0, 0, 1), thereby causing the PMOS transistor 22, the PMOS transistor 26, and the NMOS transistor 28 to be all switched ON, while causing the transmission gates 34, 36 to be both switched OFF.

In operation, if (E, EB)=(0, 0), it will cause the output (O1, O2, O3)=(0, 0, 1), thereby causing the PMOS transistor 22, the PMOS transistor 26, and the NMOS transistor 28 to be all switched ON, while causing the transmission gates 34, 36 to be both switched OFF. As a result, the overall universal crystal-oscillator I/O circuit is set to function as an NAND gate with STOP enable. E pin can be viewed as a STOP control pin.

If (E, EB)=(0, 1), it will cause the output (O1, O2, O3)=(1, 0, 1), thereby causing the PMOS transistor 22 to be switched ON, the PMOS transistor 22 to be switched OFF, and the NMOS transistor 28 to be switched ON, while causing the transmission gates 34, 36 to be both switched OFF. As a result, the overall universal crystal-oscillator I/O circuit is set to a function in a tri-state mode. In the tri-state mode, the circuit can be applied to a situation that time-sequence signals are externally inputted to the chip, such as the external test mode of the ASIC device 20.

If (E, EB)=(1, 0), it will cause the output (O1, O2, O3)=(1, 1, 0), thereby causing the PMOS transistor 22, the PMOS transistor 26, and the NMOS transistor 28 to be all switched OFF, while causing the transmission gates 34, 36 to be both switched ON. This performs like a NOT gate. As a result, the overall universal crystal-oscillator I/O circuit is set to function as an inverter.

If (E, EB)=(1, 1), it will cause the output (O1, O2, O3)=(1, 0, 1), thereby causing the PMOS transistor 22 to be switched ON, the PMOS transistor 26 to be switched OFF, and the NMOS transistor 28 to be switched ON, while causing the transmission gates 34, 36 to be both switched OFF. As a result, the overall universal crystal-oscillator I/O circuit is set to function in a tri-state mode. In the tri-state mode, the circuit can be applied to a situation that time-sequence signals are externally inputted to the chip, such as the external test mode of the ASIC device 20.

Figure 4:
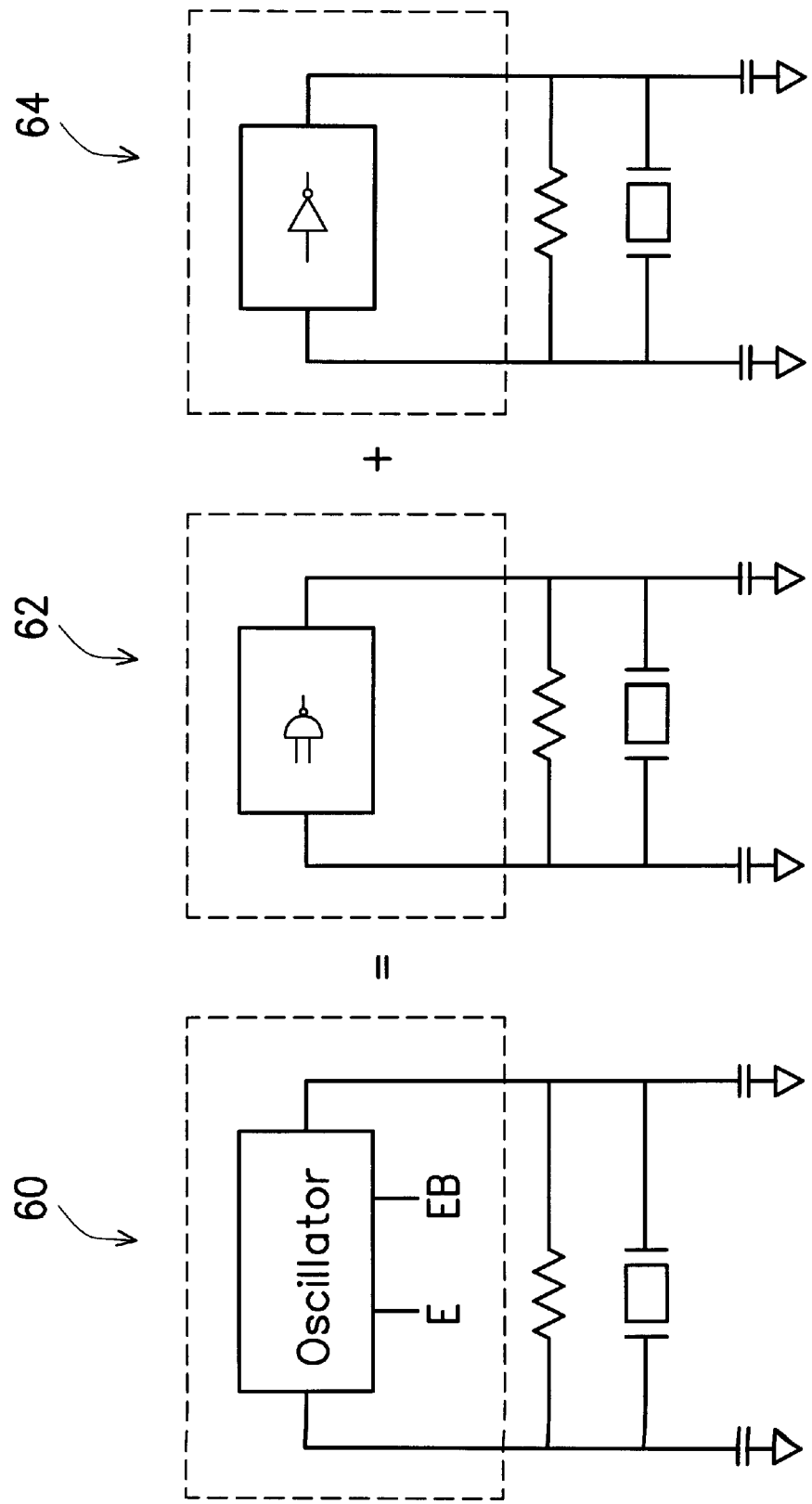
FIG. 4 is a schematic diagram used to show that a single one of the universal crystal-oscillator I/O circuit of the invention is equivalent in function to two conventional crystal-oscillator I/O components in the ASIC library.

FIG. 4 is a schematic diagram used to show the advantage of the invention over the prior art. In FIG. 4, the universal crystal-oscillator I/O circuit of the invention is designated by the reference numeral 60, while a conventional NAND-type I/O circuit is designated by the reference numeral 62, and a conventional inverter-type I/O circuit is designated by the reference numeral 64. Since the universal crystal-oscillator I/O circuit of the invention can be selectively set to function either as a NAND gate or as an inverter gate under control of the logic signal (E, EB), a single one of the universal crystal-oscillator I/O circuit of the invention is equivalent to the NAND-type I/O circuit 62 plus the inverter-type I/O circuit 64. Therefore, the invention can help reduce the total number of I/O components in the ASIC library.

Figure 5:
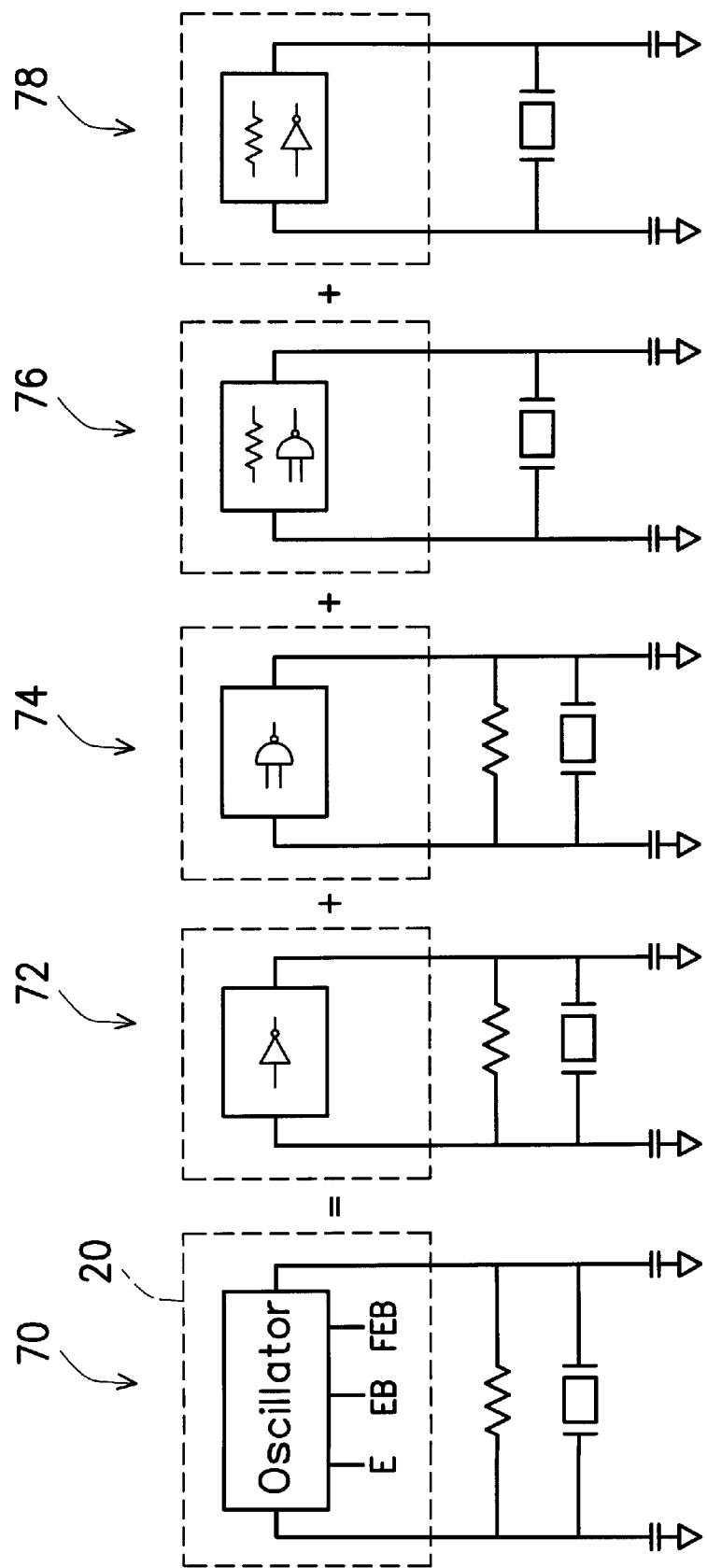
FIG. 5 is a schematic diagram used to show that a single one of the universal crystal-oscillator I/O circuit of the invention is equivalent in function to four conventional crystal-oscillator I/O components in the ASIC library.

Alternatively in another embodiment, the feedback resistor 38 shown in FIG. 2 can be instead incorporated within the ASIC device 20, and the ON/OFF state thereof is controlled by the FEB signal. In this case, a single one of the universal crystal-oscillator I/O circuit of the invention is equivalent in function to four I/O components. As shown in FIG. 5, a single one of the universal crystal-oscillator I/O circuit of the invention, as here designated by the reference numeral 70, is equivalent to four conventional I/O components including a conventional inverter-type I/O component 72, a conventional NAND-type I/O component 74, a conventional resistor-NAND-type I/O component 76, and a conventional resistor-inverter-type I/O component 78. Therefore, the invention can help reduce the total number of I/O components in the ASIC library.

Figure 6:
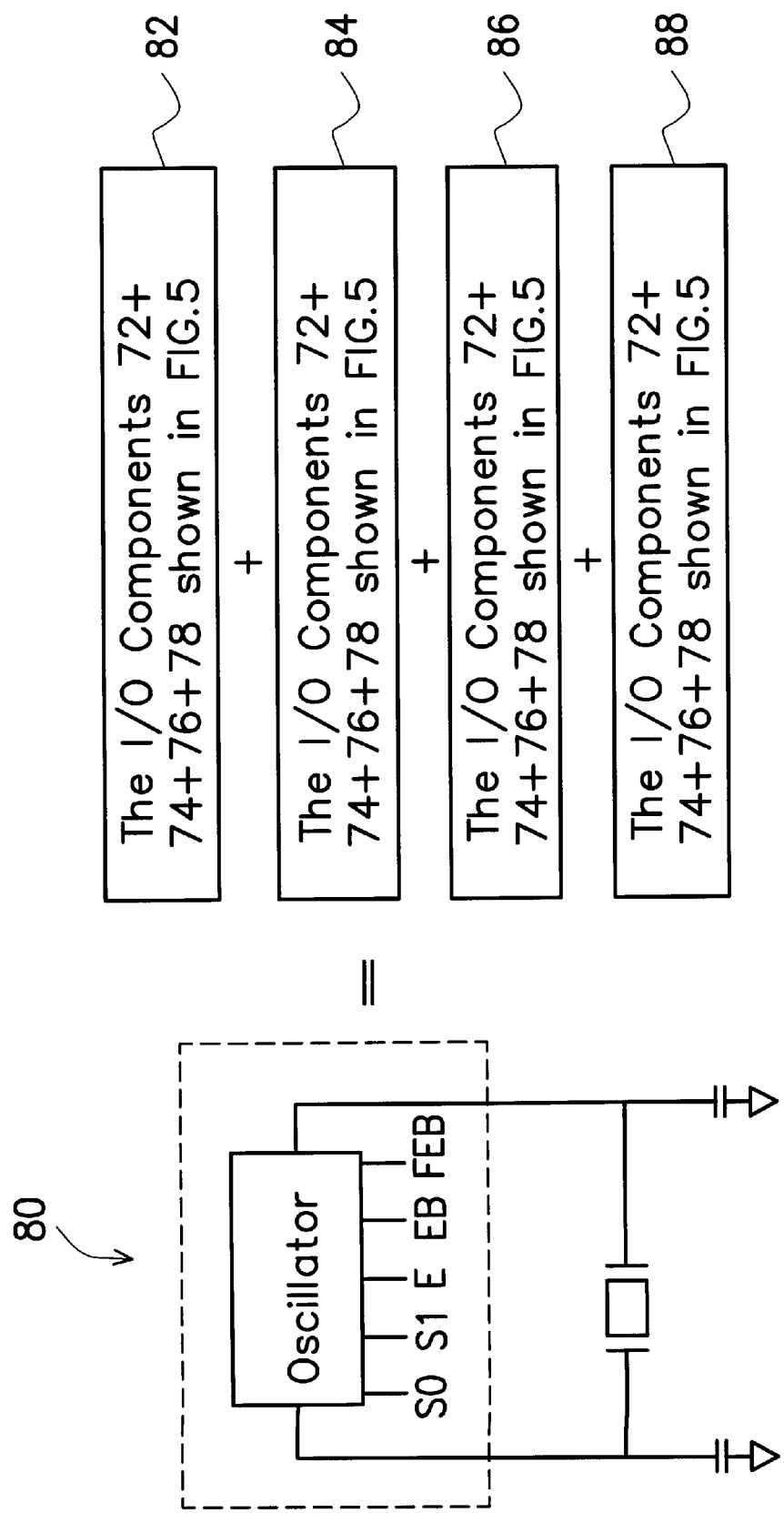
FIG. 6 is a schematic diagram used to show that a single one of the universal crystal-oscillator I/O circuit of the invention is equivalent in function to 16 conventional Crystal Oscillator Pad components in the ASIC library.

When ordering ASIC devices, some customers would request a voltage down-conversion from 3.3 V to 2.4 V or 1.5 V. To address this requirement, the invention provides a specific gain for each of the 10 MHz, 20 MHz, 30 MHz, and 40 MHz frequency settings or related operating voltage, in which the gain depends on a pushing force on the oscillator. This provision allows the universal crystal-oscillator I/O circuit of the invention to be equivalent to 4×4=16 conventional Crystal Oscillator Pad components in the ASIC library, as shown in FIG. 6. In FIG. 6, the four blocks 82, 84, 86, 88 each represent a collection of the four I/O components 72, 74, 76, 78 shown in FIG. 5. Therefore, in this case, the universal crystal-oscillator I/O circuit of the invention 80 is equivalent to 4×4=16 conventional Crystal Oscillator Pad components in the ASIC library. The four I/O components 72, 74, 76, 78 are respectively used for 10 MHz, 20 MHz, 30 MHz, and 40 MHz signal inputs. The selection of the range of the pushing force is controlled by signal sources S0 and S1 of the component 80.

The logic control unit, such as the oscillator in FIG. 6, may also have more signal sources than S0 and S1. If it has S0 and S1, it results in $2^2=4$ possible combinations, and if it has three signal sources S0, S1, and S3, then it has $2^3=8$ possible combinations. The combinations are also not limited to produce different pushing forces. The combinations can also include logic options, such as a Schmitt trigger logic, used for filtering noise. In the case of 8 combinations, it may, for example, use 4 combinations for producing pushing force gates and 4 combinations for Schmitt trigger logic gates.

It can be learned from the foregoing description that the invention provides a universal crystal-oscillator I/O circuit for ASIC, which can help reduce the total number of I/O components in the ASIC library used to construct the IC device. More specifically, a single one of the universal crystal-oscillator I/O circuit of the invention is equivalent in function to 2, 4, or even 16 conventional I/O components in the ASIC library. Therefore, the invention can help simplify the design and management of ASIC library. Moreover, the invention is more advantageous than the prior art in that the invention is faster in switching and lower in power consumption.

Referring back to FIG. 2, in CDM ESD test, the ESD current flowing into the universal crystal-oscillator I/O circuit of the invention would be drained away through the NMOS transistor of the transmission gate 36 or the NMOS transistor 28, thus preventing the internal circuitry of the ASIC device 20 from being damaged by the ESD current. The invention is therefore able to remove electrostatic electricity accumulated on the IC substrate in CDM ESD test. Moreover, the invention also possesses the advantages of conventional PIOS (Programmable I/O on Silicon) devices.

Based on simulation results, it can be found that, under the same driving voltage, the invention can achieve substantially the loop gain, phase diagram and provide almost the same negative resistance. Therefore, a single one of the universal crystal-oscillator I/O circuit of the invention is equivalent in function to a plurality of conventional I/O components, which can help reduce the total number of I/O components in the ASIC library. The use of the invention is therefore more cost-effective than the prior art.

In conclusion, the universal crystal-oscillator I/O circuit of the invention has the following advantages over the prior art.

(1) First, the invention can help reduce the total number of I/O components in the ASIC library used to construct the IC device, allowing the design and management of ASIC library to be more simplified and convenient, making ASIC more cost-effective to implement.

(2) Second, the invention can help improve the performance of the crystal-oscillator I/O circuit, allowing ASIC designers to have more convenience and flexibility in ASIC design.

(3) Third, the invention can help the ASIC device incorporating the invention to be more robust in CDM ESD protection, allowing the ASIC to easily pass CDM ESD test.

(4) Fourth, the invention has the advantages of conventional PIOS devices, including fast switching and low power consumption.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A universal crystal-oscillator input/output (I/O) circuit for use with an ASIC device with charge device mode (CDM) electrostatic discharge (ESD) protection, which comprises:

a first P-type metal-oxide semiconductor (PMOS) transistor, whose source is connected to a system voltage;

a second PMOS transistor whose source is connected to the system voltage and whose gate is connected to the drain of the first PMOS transistor;

a third PMOS transistor, whose source is connected to the system voltage and whose drain is connected to the drain of the second PMOS transistor;

a first N-type metal-oxide semiconductor (NMOS) transistor, whose source is grounded and whose drain is connected to the drain of the first PMOS transistor;

a second NMOS transistor, whose source is grounded, whose gate is connected to the drain of the first NMOS transistor, and whose drain is connected to the drain of the second PMOS transistor;

a third NMOS transistor, whose source is tied to the gate thereof and grounded, and whose drain is connected both to the drain of the third PMOS transistor and to the drain of the second NMOS transistor; and a control logic unit having three output ports respectively connected to the gate of the first PMOS transistor, the gate of the third PMOS transistor, and the gate of the first NMOS transistor, for selectively controlling the respective ON/OFF states of the first PMOS transistor, the third PMOS transistor, and the first NMOS transistor.

2. The universal crystal-oscillator I/O circuit of claim 1, further comprising:

a first transmission gate whose output port is connected to the drain of the first PMOS transistor and whose control port is connected to the control logic unit, with the ON/OFF state thereof being controlled by the control logic unit; and a second transmission gate whose input port is connected to the input port of the first transmission gate, and whose output port is connected to the drain of the first NMOS transistor, and whose control port is connected to the control logic unit, with the ON/OFF state thereof being controlled by the control logic unit.

3. The universal crystal-oscillator I/O circuit of claim 2, wherein the first NMOS transistor and an NMOS transistor used in the second transmission gate are used as a CDM ESD protection circuit.

4. The universal crystal-oscillator I/O circuit of claim 2, wherein the first transmission gate and the second transmission gate are formed by comprising at least one PMOS transistor.

5. The universal crystal-oscillator I/O circuit of claim 2, wherein the first transmission gate and the second transmission gate are formed by comprising at least one NMOS transistor.

6. The universal crystal-oscillator I/O circuit of claim 2, wherein the first transmission gate and the second transmission gate are formed by comprising at least one NMOS transistor and at least one PMOS transistor.

7. The universal crystal-oscillator I/O circuit of claim 1, further comprising:

a feedback resistor having a first end connected both to the drain of the first PMOS transistor and to the drain of the first NMOS transistor, and a second end connected both to the drain of the second NMOS transistor and to the drain of the third NMOS transistor; and a crystal oscillator connected in parallel with the feedback resistor;

wherein both the feedback resistor and the crystal oscillator are mounted on the outside of the ASIC device.

8. The universal crystal-oscillator I/O circuit of claim 7, wherein the feedback resistor is mounted on the inside of the ASIC device.

9. The universal crystal-oscillator I/O circuit of claim 1, wherein the third PMOS transistor and the third NMOS transistor are used for HBM ESD protection.

10. The universal crystal-oscillator I/O circuit of claim 1, wherein the control logic unit responds to a two-bit input logic signal to generate a three-bit output logic signal whose three bits are respectively used to control the ON/OFF states of the third PMOS transistor, the first PMOS transistor, and the first NMOS transistor.

11. The universal crystal-oscillator I/O circuit of claim 10, wherein when the two-bit input logic signal is (0, 0), the three-bit output logic signal is (0, 0, 1).

12. The universal crystal-oscillator I/O circuit of claim 10, wherein when the two-bit input logic signal is (0, 1), the three-bit output logic signal is (1, 0, 1).

13. The universal crystal-oscillator I/O circuit of claim 10, wherein when the two-bit input logic signal is (1, 0), the three-bit output logic signal is (1, 1, 0).

14. The universal crystal-oscillator I/O circuit of claim 10, wherein when the two-bit input logic signal is (1, 1), the three-bit output logic signal is (1, 0, 1).

* * * * *